(12) United States Patent
Foxenland

(10) Patent No.: US 8,218,321 B2
(45) Date of Patent: Jul. 10, 2012

(54) SELF-COOLING ELECTRICAL DEVICE

(75) Inventor: Eral Foxenland, Malmö (SE)

(73) Assignee: Sony Mobile Communications AB, Lund (SE)

( * ) Notice: Subject to any disclaimer, the term of this patent is extended or adjusted under 35 U.S.C. 154(b) by 135 days.

(21) Appl. No.: 12/759,847

(22) Filed: Apr. 14, 2010

(65) Prior Publication Data

US 2011/0255244 A1 Oct. 20, 2011

(51) Int. Cl.
*H05K 7/20* (2006.01)
(52) U.S. Cl. ........ 361/700; 361/680; 361/707; 361/708; 361/714; 165/104.33; 174/15.1
(58) Field of Classification Search .................. None
See application file for complete search history.

(56) References Cited

U.S. PATENT DOCUMENTS

| | | | | |
|---|---|---|---|---|
| 5,007,478 | A * | 4/1991 | Sengupta | 165/10 |
| 6,317,321 | B1 * | 11/2001 | Fitch et al. | 361/700 |
| 6,542,359 | B2 * | 4/2003 | Babcock et al. | 361/679.46 |
| 6,621,702 | B2 * | 9/2003 | Elias et al. | 361/700 |
| 6,672,370 | B2 * | 1/2004 | Searls et al. | 165/10 |
| 2003/0142477 | A1 * | 7/2003 | Elias et al. | 361/700 |
| 2005/0280987 | A1 * | 12/2005 | Kwitek et al. | 361/687 |
| 2009/0154113 | A1 * | 6/2009 | MacDonald | 361/720 |
| 2010/0254092 | A1 * | 10/2010 | Dong et al. | 361/705 |

\* cited by examiner

*Primary Examiner* — Boris Chervinsky
(74) *Attorney, Agent, or Firm* — Snyder, Clark, Lesch & Chung, LLP

(57) ABSTRACT

The invention relates to a portable electronic device, e.g. a mobile phone, comprising a shell, a display, a battery, a processor and a receiver. In the portable electronic device is at least one of the components configured to heat exchange with a phase changing material which is arranged within the portable electronic device.

20 Claims, 4 Drawing Sheets

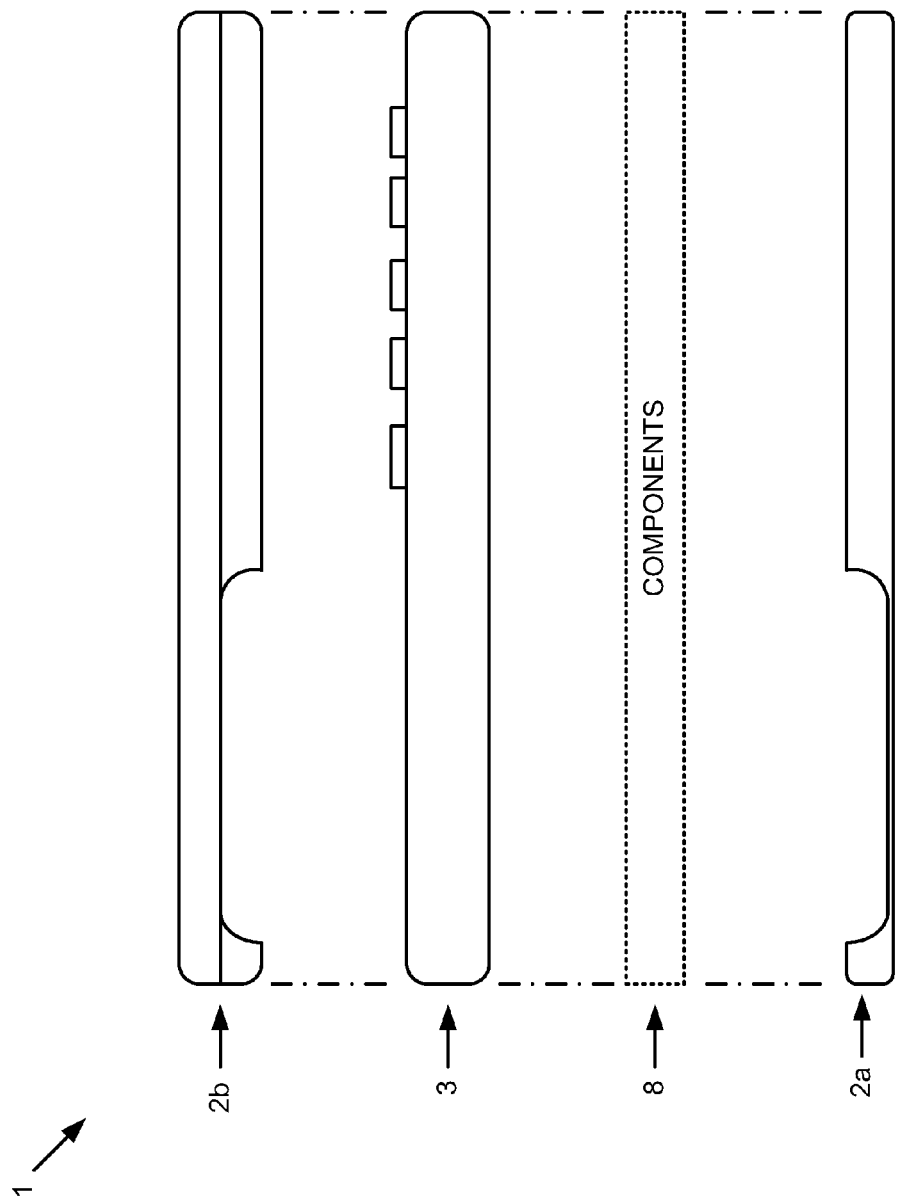

SELF-COOLING ELECTRICAL DEVICE

TECHNICAL FIELD

The present invention relates to a portable electronic device, e.g. a mobile phone.

BACKGROUND

Most electronic devices such as computers, mobile phones and other components upholding an electrical circuitry or processor generate heat during use. This heat is generally removed, or transferred away from the device by providing air circulation through the device or heat sinks. The air flow that cools the device is normally generated by a fan incorporated within the device. The drawback of using a fan in the device is the generation of sound and the utilization of energy for running the fan. Furthermore, certain devices such as mobile phones do not normally contain a fan due to restrictions in the size of the telephone. Consequently after a period of use the device becomes hot. The increased temperature may reduce the period during which the battery can be active. Moreover, the temperature raise of the device makes the device not comfortable to use.

SUMMARY

One aspect of the present invention is to arrange a portable electronic device which during warm and hot circumstances or environments is self-cooling providing an improved duration of the battery. One further aspect is to provide for a user of the portable electronic device a pleasant cool and refreshing feeling when the portable electronic device is used and held in the hand or against/adjacent the ear and chin.

One further aspect is to provide a portable electronic device which is self-cooling without need of auxiliary means, such as electrical or mechanical devices.

One further aspect is to overcome above mentioned drawbacks.

Aspects described above may be achieved according to the invention by a portable electronic device comprising a shell and at least one operational component, wherein the at least component or shell is configured to heat exchange with a phase changing material arranged in the portable electronic device. An advantage achieved by the portable electronic device is that the portable electronic device is self-cooling without use of electricity above a certain temperature.

An aspect relates to the portable electronic device in that the phase changing material has a melting temperature higher than body temperature of a user of the device. This has the effect that at a temperature below and up to a body temperature no phase change will take place. Consequently the phase change will not start by a person holding the electronic device in his or her hand or keeping it in a pocket.

An aspect relates to the portable electronic device in that the thermal phase changing material is an ionic material. Ionic materials normally have a high melting point. This is due to that the ionic compounds between particles of the material have strong electrostatic bonds which results in the high melting point. The high melting point makes ionic materials suitable as they are solid at room temperature.

An aspect relates to the portable electronic device in that the ionic material is a salt, or a mixture of salt. A property of salts is that they have a high volumetric latent heat storage capacity. A further advantage of salt is that it is low cost and fairly easy available. A characteristic of the melting point of salt or compounds of salt is the sharpness of the melting point. The salt may be hydrated salt. Hydrated salt is salt which is water-based. By this phase changing material, also called PCM, of such salts may freeze and melt at temperatures higher than 0 degrees Celsius. That salt is hydrated means that it may bind water in a crystallized form. When the crystal thus is heated it melts and releases the water of crystallization whereby it absorbs energy in form of latent heat.

An aspect relates to the portable electronic device in that the phase changing material is solid, frozen, at temperature ranging from −20 degrees to +45 degrees Celsius. An effect of this is that at temperature above +45 degrees Celsius the phase changing material changes from solid to liquid phase. During this "melting process," the phase changing material absorbs heat from surrounding atmosphere or components at an almost constant temperature. This process continues, without a significant rise in the temperature, until all the material has transformed into a liquid phase. Therefore, as long as "melting" proceeds, heat from the components is transferred to the phase changing material thereby cooling down the components.

An aspect relates to the portable electronic device in that the phase changing material is contained in a receptacle. In this way the phase changing material will be kept in one place when contained in a receptacle. When the phase changing material is in liquid state it must be contained such that it does not flow away to other parts of the device, or even away from the device.

An aspect relates to the portable electronic device in that the receptacle is thermally conductive. An effect of this is an optimized heat flux from a component to the phase changing material. An element, wall part of the receptacle, if not conductive, would reduce the flux between a component and the phase changing material.

An aspect relates to the portable electronic device in that the receptacle is a closed compartment within the device. An effect of this is that a shell can comprise a compartment containing the phase changing material. An effect of this is that a user can switch shells to another one having e.g. another appearance, or can replace a broken or damaged shell with a new shell comprising the compartment with the phase changing material.

An aspect relates to the portable electronic device in that the receptacle is releasably arranged in the device. An effect of this is that the receptacle can be changed. Reason for changing could be that receptacle is damaged, or needs to be changed and replaced with a phase changing material which is advantageous compared to the previous phase changing material.

An aspect relates to the portable electronic device in that the phase changing material is arranged as a layer in the shell. An effect of this is that a large area of the mobile device can be covered with the phase changing material. A large area of the device can therefore be provided to take up heat from the device. The layer is preferably arranged inside the shell on e.g. a backside of the device. A further effect of the application on a backside of the device of the phase changing material in layer is only a minor effect on the thickness of the device.

An aspect relates to the portable electronic device in that the phase changing material in the device is arranged adjacent to the battery. An effect of providing the phase changing material adjacent to the battery is that when temperature of the device or the battery exceeds melting point of the phase changing material, the battery is being cooled from the phase changing material as long as the melting of the phase changing material proceeds. The cooling of the battery will prolong its duration. The phase changing material can be applied as a layer between the electronic device and the battery. This will have the effect that the phase changing material thus can provide cooling of the battery as well as any component in the electronic device arranged adjacent to the battery.

An aspect relates to the portable electronic device in that the phase changing material in the device is arranged such that it encloses the battery. An effect of this is that the phase changing material will provide cooling on at least two sides of the battery. One side of the battery and the shell that face a surface of which the device is applied on, e.g. inside of a hand, and one side facing towards internal of the electronic device. This has the advantage that for a user it feels comfortable as the device itself provides a pleasant feeling when holding and using it.

An aspect relates to the portable electronic device in that the phase changing material in the device is encapsulated in elements of the device used for operation of the device. The phase changing material can be encapsulated and arranged within buttons, or element of which the buttons are arranged. The buttons and element carrying the buttons can then provide cooling of the device via a rear side of the button and element.

BRIEF DESCRIPTION OF THE DRAWINGS

A preferred embodiment of the device according to the invention is described below in more detail with reference to the attached schematic drawings, which only show the parts needed for understanding the invention.

FIGS. 1 & 4 illustrate views from above a portable electronic device with main components divided in separate sections.

DETAILED DESCRIPTION

Figure 1:
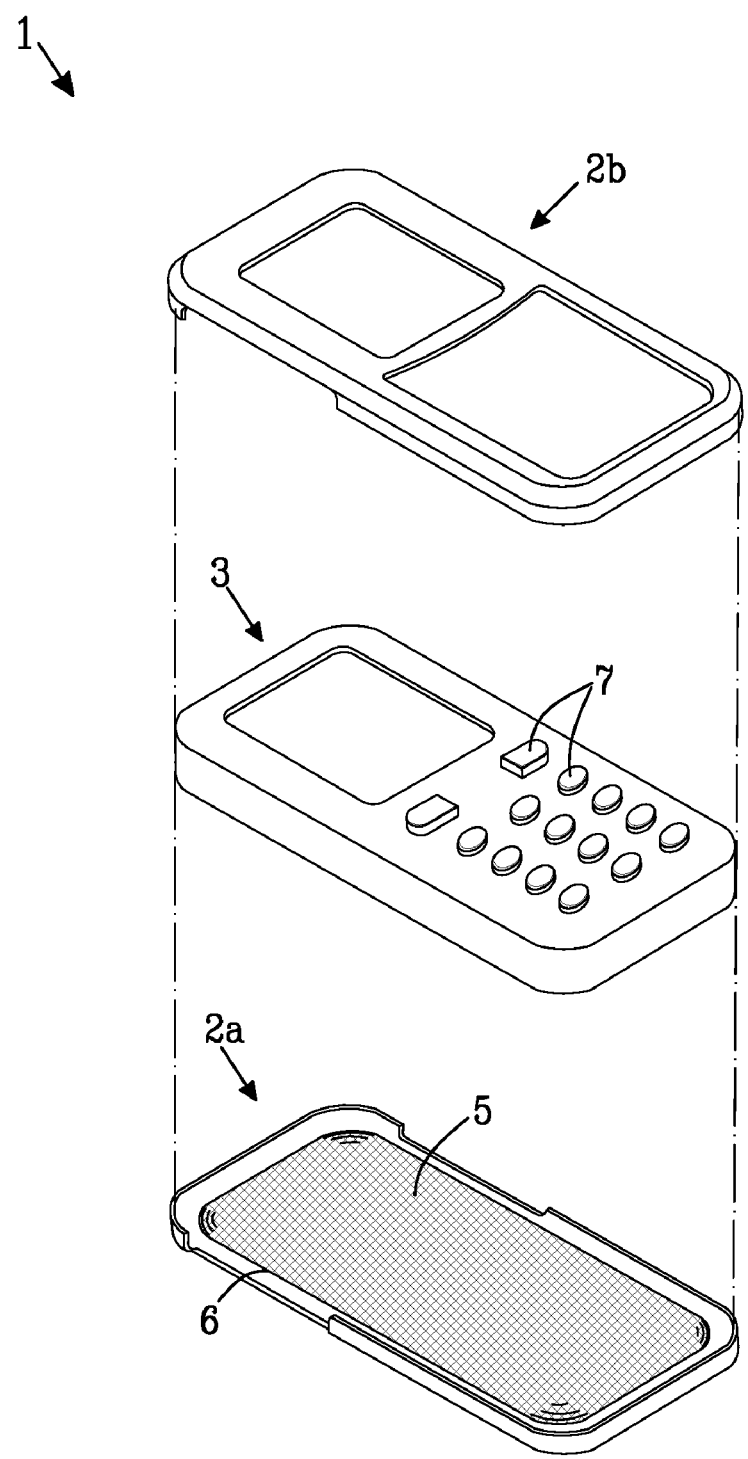
Figure 2:
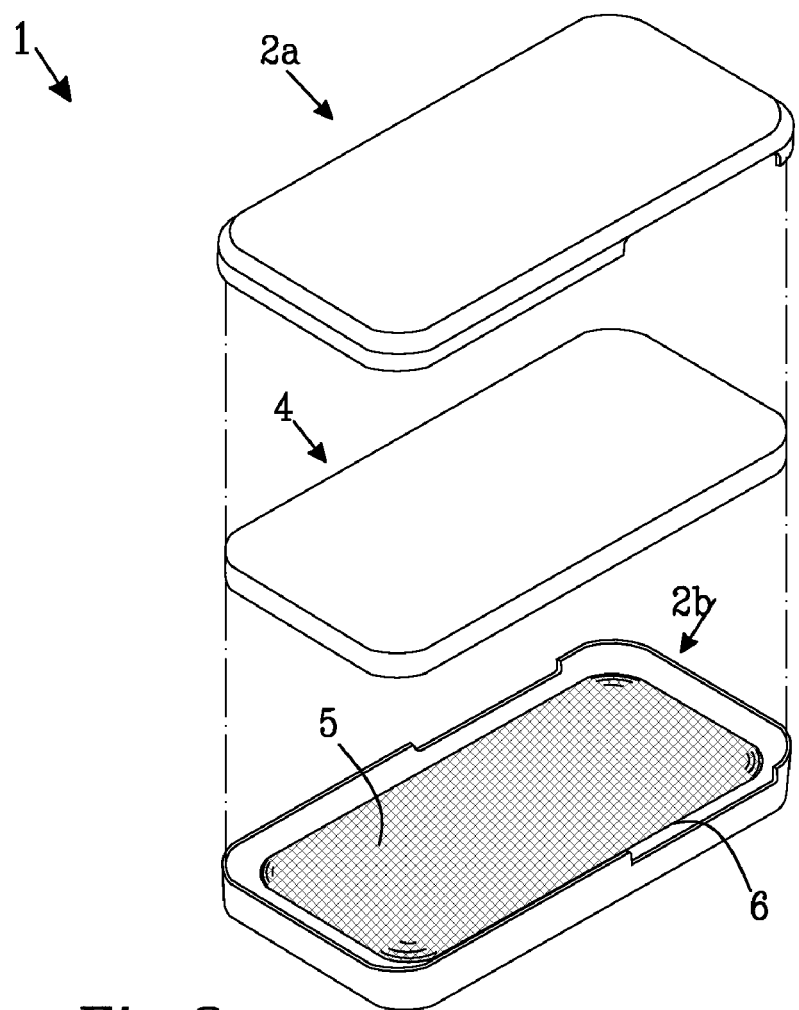
FIG. 2 view from below of a portable electronic device with main components divided in separate sections.

FIG. 1 discloses a portable electronic device (1), e.g. a mobile phone, having a shell (2a, 2b) an internal body comprising components such as display (3), battery (4, see FIG. 2). The shell comprises a bottom shell (2a) and a top shell (2b) enclosing the internal body there between. The portable electronic device further comprises electrical components (8) such as processing unit, transceiver and drivers (shown in FIG. 4). The portable electronic device (1) according to the present invention further comprises a phase changing material (5). This phase changing material (5) may be applied as an enclosed layer in the portable electronic device (1) in the shell or on a circuit-board or any other convenience position. The phase changing material (5) comprises a salt, or a mixture of salt. Salt is an ionic material. One advantage with salt is that it has a sharp melting point. The sharp melting point makes it possible to provide a mixture of salt with a desired melting point. Namely, the temperature it is desired that the phase changing material starts its melting process. When melting process proceeds, the phase changing material transforms from a solid state to a liquid state. During this phase change the temperature of the material remains significantly leveled around the melting temperature of the phase changing material. Due to this, the phase changing material can absorb heat from adjacent components having a temperature higher than the melting temperature of the phase changing material. The absorption continues until the phase changing material is totally liquidized. The phase changing material returns back to solid state when ambient temperature of the phase changing material is decreased to a temperature below the melting point. When returning back to the solid state, stored latent heat within the phase changing material is released. The characteristics of the phase changing material as described can therefore be applied as a cooling element in order to remove heat from components without using electricity. A phase changing material which may have a melting point at 45 degrees Celsius is chosen due to temperatures above this temperature for a user may result in an unpleasant feeling (e.g., it may feel too hot against the skin of a user). Further, e.g. if the portable electronic device is laid upon a surface of a table which has been exposed to, e.g., the sun, the electronic device will prolong its battery duration as the effect of the heat from the surface will be delayed as long as the melting of the phase changing material proceeds.

In FIG. 1 a phase changing material is applied in a receptacle (6) comprising the phase changing material (5). The use of a receptacle (6) is advantageous due to the phase changing material changing from solid to liquid state. The receptacle (6), when it is in liquid state, prevents the phase changing material from floating away. The receptacle (6) with phase changing material (5), as disclosed, in FIG. 1 is applied in conjunction with the bottom shell (2a). The receptacle (6) is applied on the inner surface of the bottom shell (2a). On the inside of the bottom shell, the receptacle (6) may either be attached using adhesive or other known fixing arrangement. In accordance with another embodiment the bottom shell (2a) comprises a compartment in which the receptacle (6) is arranged (not shown in figure). The receptacle is thermally conductive. This is in order to avoid or minimize any reduction of the effect regarding the heat flux through the wall element. In accordance with a third embodiment, the receptacle may be a wall element of the receptacle arranged partly with an isolated material and an opposite wall element may comprise a thermally conductive material. This has the effect that the receptacle will heat exchange through areas of the receptacle comprising a thermally conductive material, and not through the areas being isolated.

FIG. 2 discloses a view of a portable electronic device (1) facing an opposite direction compared to the portable electronic device (1) as disclosed in FIG. 1. In accordance with one embodiment as disclosed in FIG. 2 a phase changing material (5) is applied within the receptacle (6) on an inner side of a battery (4) of the portable electronic device (1). In this position of the phase changing material (5) both the battery (4), as well as the internal components of the portable electronic device (1), are cooled. In accordance with a fourth embodiment a phase changing material (5) as described above in conjunction with FIG. 1 is applied on the inside of the bottom shell (2b) in FIG. 2 (not shown in figure). Further, opposite the bottom shell (2a) under the battery (4) is applied, as described above, another phase changing material as seen in FIG. 2. This has the effect that the phase changing material can be applied such that a battery (4) is placed between the layers of the phase changing material.

As described above, one further aspect is that the phase changing material within the receptacle can be applied as form of layers. The use of layers enables the phase changing material to be placed on flat surfaces in the portable electronic device (1) without affecting the size (thickness) of the device.

Figure 3:
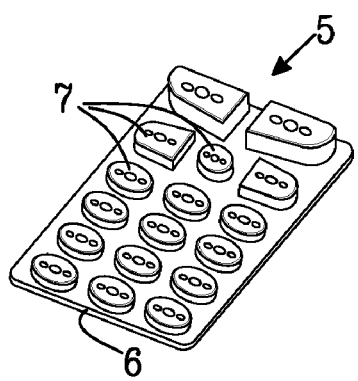
FIGS. 3, 5A, 5B and 5C illustrate views of an element comprising buttons applied on a mat to a portable electronic device.
Figure 5A:
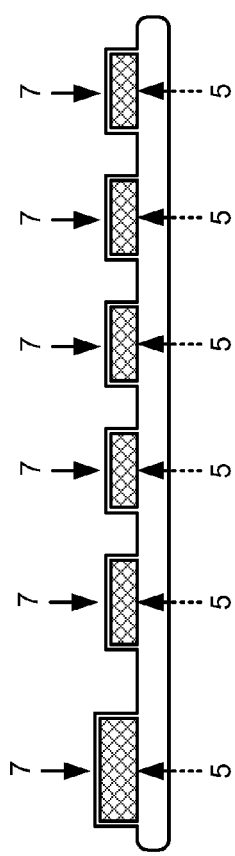
Figure 5B:
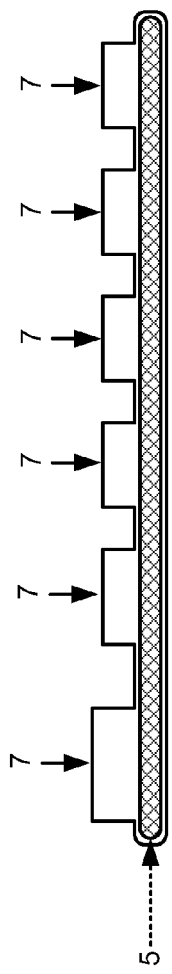
Figure 5C:
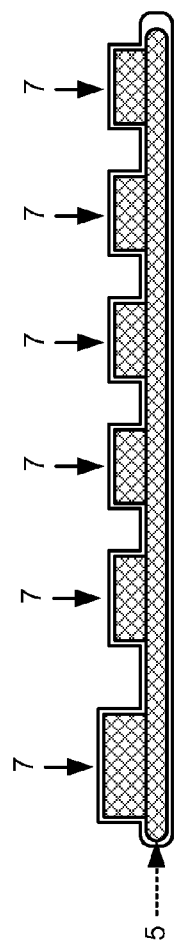

FIG. 3 illustrates a further embodiment where the phase changing material (5) is arranged in a receptacle of an element (7) shaped as a buttons of the portable electronic device (1). Furthermore, the element (7) may be shaped as the buttons comprising an associated mat to which the buttons are applied. The phase changing material is, in accordance with FIG. 3, applied inside the buttons (FIG. 5A) and/or inside the mat of the buttons (FIGS. 5B & 5C). The buttons and/or the mat in accordance with FIG. 3 can constitute the buttons of the element (7) in FIG. 1. This has the effect that the buttons, element (7), in FIG. 1 will cool the portable electronic device (1) and its internal components towards the bottom shell (2a). Simultaneously the phase changing material (5) of FIG. 1, which is applied on and with the bottom shell (2a), will cool the portable electronic device (1) and its internal components (primarily the battery) in a direction towards the buttons (7). In a further embodiment, a phase changing material may be applied on the inside of the battery as described in FIG. 2 resulting in that three layers of phase changing material is applied in the portable electronic device (1) (not shown in figure).

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be implemented at least in part by means of both hardware and software, and that several "means", "units" or "devices" may be represented by the same item of hardware.

A "device" as the term is used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) terminal that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc.

The invention is not limited to the embodiment referred to but may be varied and modified within the scopes of the claims set out below, as partly described above.

What we claim is:

1. A portable electronic device, comprising:
   one or more internal components;
   a button mat and a plurality of buttons applied to the button mat, wherein the button mat is disposed adjacent the one or more internal components within the portable electronic device; and
   a phase changing material, wherein the phase changing material is applied inside the plurality of buttons, and wherein the one or more internal components exchange heat with the phase changing material applied inside the plurality of buttons.

2. The portable electronic device of claim 1, wherein the phase changing material has a melting temperature higher than a body temperature of a user of the device.

3. The portable electronic device of claim 1, wherein the phase changing material is an ionic material.

4. The portable electronic device of claim 3, wherein the ionic material is a salt, or a mixture of salt.

5. The portable electronic device of claim 1, wherein the phase changing material is solid at temperatures ranging from −20 degrees to +45 degrees Celsius.

6. The portable electronic device of claim 1, wherein the phase changing material is further applied inside the button mat and wherein the one or more internal components exchange heat with the phase changing material applied inside the button mat.

7. The portable electronic device of claim 6, further comprising:
   a receptacle shaped as at least one of the buttons or the mat, wherein the phase changing material is applied inside the receptacle and wherein the receptacle is thermally conductive.

8. The portable electronic device of claim 7, wherein the receptacle comprises one or more closed compartments within the device.

9. The portable electronic device of claim 1, further comprising:
   a receptacle, wherein the phase changing material is further applied inside the receptacle and wherein the receptacle is releasably arranged in the device.

10. The portable electronic device of claim 1, wherein the phase changing material is further arranged as a layer in the portable electronic device.

11. The portable electronic device of claim 10, wherein the layer of phase changing material is arranged adjacent to a battery in the device.

12. The portable electronic device of claim 10, wherein the layer of phase changing material is arranged such that it encloses a battery in the device.

13. The portable electronic device of claim 1, wherein the phase changing material is further encapsulated in elements of the device used for operation of the device.

14. An article of manufacture, comprising:
   an element shaped as buttons and a button mat, wherein the buttons are applied to the button mat; and
   a phase changing material,
      wherein the phase changing material is applied inside at least one of the buttons or the button mat, and
      wherein the phase changing material exchanges heat with at least one component of a portable electronic device.

15. The article of manufacture of claim 14, wherein the phase changing material has a melting temperature higher than a body temperature of a user of the portable electronic device.

16. The article of manufacture of claim 14, wherein the ionic material is a salt, or a mixture of salt.

17. The article of manufacture of claim 16, wherein the salt is a hydrated salt.

18. The article of manufacture of claim 14, wherein the phase changing material is solid at temperatures ranging from −20 degrees to +45 degrees Celsius and liquid at temperatures above +45 degrees Celsius.

19. The article of manufacture of claim 14, wherein the phase changing material is further arranged as a layer in the portable electronic device.

20. The article of manufacture of claim 19, wherein the layer of phase changing material is arranged adjacent to a battery of the portable electronic device.

* * * * *